United States Patent [19]

Hamasaki et al.

[11] Patent Number: 4,918,320
[45] Date of Patent: Apr. 17, 1990

[54] ALIGNMENT METHOD USABLE IN A STEP-AND-REPEAT TYPE EXPOSURE APPARATUS FOR EITHER GLOBAL OR DYE-BY-DYE ALIGNMENT

[75] Inventors: Bunei Hamasaki, Yokohama; Hajime Igarashi, Kawasaki; Akiya Nakai, Tokyo; Naoki Ayata, Machida, all of Japan

[73] Assignee: Canon Kabushiki Kaisha, Tokyo, Japan

[21] Appl. No.: 170,359

[22] Filed: Mar. 18, 1988

[30] Foreign Application Priority Data

| Mar. 20, 1987 | [JP] | Japan | 62-064327 |
| Mar. 20, 1987 | [JP] | Japan | 62-064328 |
| Mar. 20, 1987 | [JP] | Japan | 62-064329 |
| Mar. 20, 1987 | [JP] | Japan | 62-064330 |
| Mar. 20, 1987 | [JP] | Japan | 62-064331 |
| Mar. 20, 1987 | [JP] | Japan | 62-064332 |
| Mar. 20, 1987 | [JP] | Japan | 62-064333 |
| Mar. 20, 1987 | [JP] | Japan | 62-064334 |
| Mar. 20, 1987 | [JP] | Japan | 62-064335 |

[51] Int. Cl.$^4$ ............................................. G01H 21/86
[52] U.S. Cl. ...................................... 250/548; 356/401
[58] Field of Search .............................. 250/548, 557; 356/399–401; 364/559, 490, 491

[56] References Cited

U.S. PATENT DOCUMENTS

| 4,362,385 | 12/1982 | Lobach | 250/548 |
| 4,669,866 | 6/1987 | Phillips | 356/401 |
| 4,780,615 | 10/1988 | Suzuki | 356/400 |
| 4,780,617 | 10/1988 | Umatate et al. | |
| 4,792,693 | 12/1988 | Yamaguchi | 356/401 |
| 4,801,808 | 1/1989 | Hamaski | 250/548 |

Primary Examiner—David C. Nelms
Assistant Examiner—K. Shami
Attorney, Agent, or Firm—Fitzpatrick, Cella, Harper & Scinto

[57] ABSTRACT

A method of aligning a semiconductor wafer, usable in a step-and-repeat type exposure apparatus for projecting, in a reduced scale, images of a pattern formed on a reticle upon different shot areas on the semiconductor wafer in a predetermined sequence. According to this alignment method, the wafer is moved stepwise before the initiation of step-and-repeat exposures of the shot areas on the wafer and in accordance with a predetermined layout grid concerning the sites of the shot areas on the wafer. While moving the wafer stepwise in this manner, any positional deviation of each of some of the shot areas with respect to the layout grid is measured by use of a reduction projection lens system and, from the results of measurement, a corrected grid is prepared according to which grid the amount of stepwise movement of the wafer to be made for the step-and-repeat exposures thereof is determined. By this, for the exposures, the wafer can be moved stepwise exactly in accordance with the actual layout of the shot areas. Sample shot areas which are the subject of measurement can be selected under predetermined conditions. Additionally, of the values obtained as a result of the measurement, any extraordinary one or ones may be determined on the basis of the variance and then are excluded at the time of calculations made to determine the corrected grid. Thus, the stepwise movement of the wafer for the step-and-repeat exposures thereof can be controlled with higher precision.

13 Claims, 6 Drawing Sheets

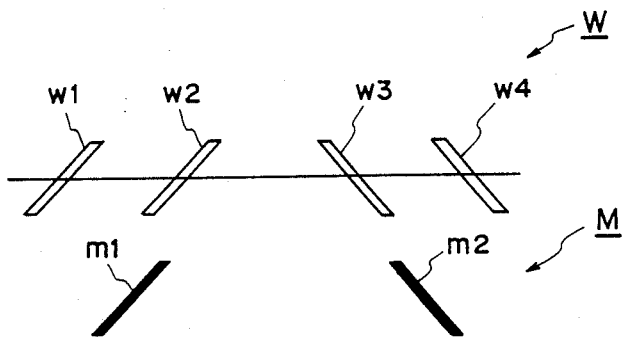
FIG. 2A
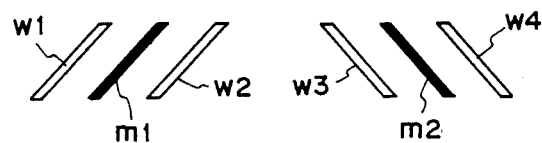
FIG. 2B
FIG. 2C
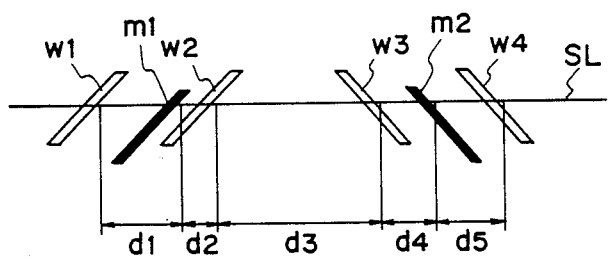
FIG. 2D
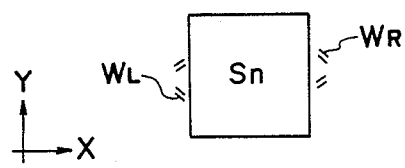
FIG. 3

ALIGNMENT METHOD USABLE IN A STEP-AND-REPEAT TYPE EXPOSURE APPARATUS FOR EITHER GLOBAL OR DYE-BY-DYE ALIGNMENT

FIELD OF THE INVENTION AND RELATED ART

This invention relates to an alignment method. More particularly, the invention is concerned with an alignment method suitably usable in a step-and-repeat type exposure apparatus for use in the manufacture of semiconductor microcircuit devices, for precisely aligning each of different portions of a workpiece such as a semiconductor wafer with respect to an original such as a mask or reticle (hereinafter simply "reticle").

The recent trend of further miniaturization of semiconductor microcircuits such as integrated circuits (ICs), large scaled integrated circuits (LSIs), etc. and higher integration of these microcircuits has forced further improvements in exposure apparatuses for use in the manufacture of these semiconductor microcircuits. Particularly, at present, it is required for an exposure apparatus to have an alignment performance capable of aligning an original and a workpiece with a precision of an order of submicrons.

As one type of exposure apparatuses usable for the manufacture of semiconductor microcircuits, step-and-repeat type exposure apparatuses are known, each being called "stepper". In such an exposure apparatus, images of a pattern formed on an original such as a reticle are projected, by use of a projection lens system and in a reduced scale, sequentially upon different portions (shot areas) of a workpiece such as a semiconductor wafer while moving the wafer stepwise under the projection lens system. In this manner, the different portions of one wafer are exposed in sequence to the pattern of the reticle.

As alignment methods usable in such a stepper, there are two types. One is called a "die-by-die alignment method" wherein, each time one shot area of a wafer is going to be exposed, any positional deviation thereof with respect to a certain reference such as a reticle is detected and the one shot area is aligned in accordance with the detection. The other type is called a "global alignment method" wherein a wafer is aligned as a whole in accordance with detection of positional errors made with respect to a suitable number of shot areas on the wafer and, then, the wafer is exposed while being moved stepwise in accordance with the layout of the shot areas on the wafer.

Generally, higher pattern-overlay accuracy is attainable with the die-by-die alignment method because, according to this method, each shot area of the wafer is subjected to the position detection. However, it requires a longer time to process one wafer, with a disadvantageous result of decreased throughput as compared with that attainable by the global alignment method. While the global alignment method can reduce the process time per one wafer, it involves a problem of decreased pattern overlay accuracy with respect to each shot area of the wafer, as compared with that attainable with the die-by-die alignment method.

SUMMARY OF THE INVENTION

It is an object of the present invention to provide an improved alignment method which is particularly suitably usable in an exposure apparatus of the step-and-repeat type and which assures high alignment accuracy and high throughput at the same time.

It is another object of the present invention to provide an improved global alignment method which ensures improved pattern overlay accuracy.

It is a further object of the present invention to provide an improved die-by-die alignment method which ensures improved throughput.

It is a yet further object of the present invention to provide an improved die-by-die alignment method which ensures further improvement in the pattern overlay accuracy.

Briefly, according to one aspect of the present invention, to achieve at least one of the above objects, there is provided an alignment method, usable with a first object having a pattern, a second object having different shot areas and a projection optical system effective to expose the shot areas of the second object to the pattern of the first object in a step-and-repeat manner, for aligning in sequence the shot areas of the second object with respect to a projection region upon which the pattern of the first object is projected by the projection optical system, said method comprising the steps of:

moving the second object in an X direction and/or a Y direction before start of the step-and-repeat exposures and effecting a first measurement for detecting, by use of the projection optical system, a positional error of each of at least two shot areas of the second object with respect to said projection region;

rotationally moving the second object in a $\theta$ direction in accordance with the first measurement to determine the position of the second object with respect to the $\theta$ direction;

moving again the second object in the X direction and/or the Y direction after determination of the position of the second object with respect to the $\theta$ direction and effecting a second measurement for detecting, by use of the projection optical system, a positional error of each of at least two shot areas of the second object with respect to said projection region;

preparing and storing information concerning the layout of the shot areas of the second object on the basis of the second measurement; and controlling the movement of the second object in the X direction and/or the Y direction at the time of the step-and-repeat exposures, in accordance with the stored information, so as to align in sequence the shot areas of the second object with respect to said projection region.

In accordance with one preferred form of the present invention which will be described later, there is provided a method of aligning a semiconductor wafer, usable in a step-and-repeat type exposure apparatus for projecting, in a reduced scale, images of a pattern formed on a reticle upon different shot areas on the semiconductor wafer in a predetermined sequence. According to this alignment method, the wafer is moved stepwise before the initiation of step-and-repeat exposures of the shot areas on the wafer and in accordance with a predetermined layout grid concerning the sites of the shot areas on the wafer. While moving the wafer stepwise in this manner, any positional error of each of some of the shot areas with respect to the layout grid is measured by use of a reduction projection lens system and, from the results of measurement, a corrected grid is prepared according to which grid the amount of stepwise movement of the wafer to be made for the step-and-repeat exposures thereof is controlled. By this, for the exposures, the wafer can be moved stepwise exactly in accordance with the actual layout of the shot areas. Sample shot areas which are the subject of measurement can be selected under predetermined conditions. Additionally, of the values obtained as a result of the measurement, any extraordinary one or ones may be determined on the basis of the variance and then are excluded at the time of calculations made to determine the corrected grid. Thus, the stepwise movement of the wafer for the step-and-repeat exposures thereof can be controlled with higher precision.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A–2D are schematic representations, respectively, for explaining the manner of scanning or alignment marks of a reticle and a wafer, for aligning them.

FIG. 3 is a schematic representation showing an example of alignment marks provided in relation to each shot area on a wafer.

DESCRIPTION OF THE PREFERRED EMBODIMENTS

Figure 1:
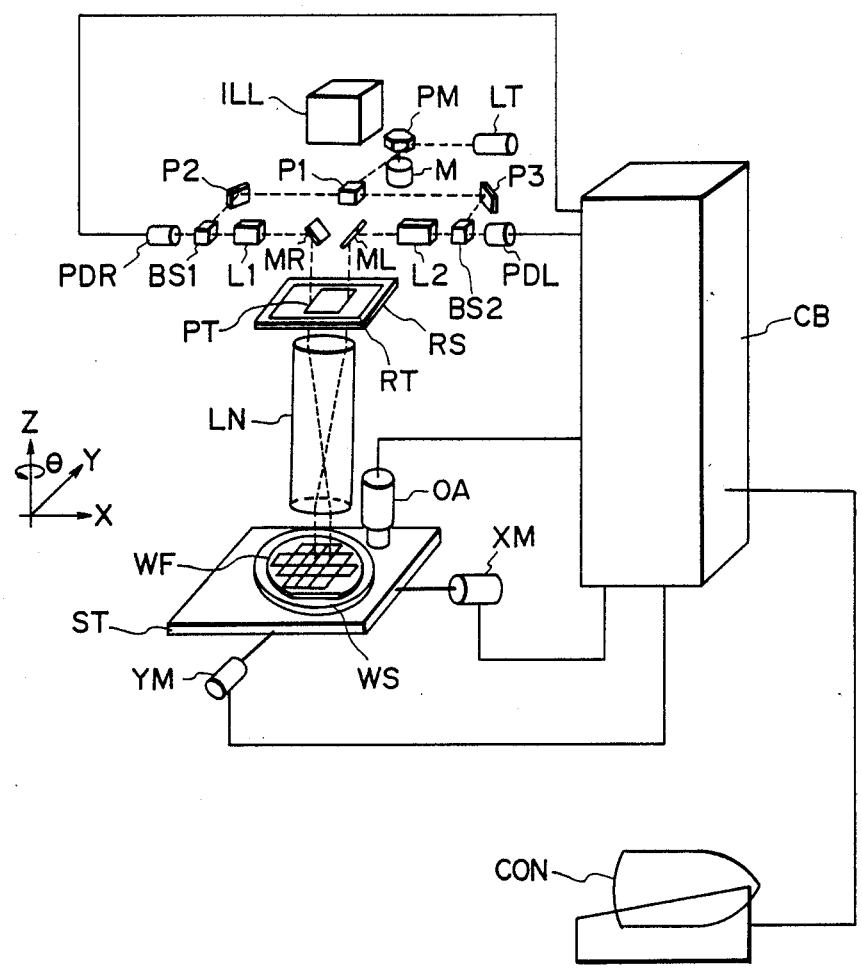
FIG. 1 is a schematic view of a semiconductor microcircuit manufacturing exposure apparatus of step-and-repeat type, to which an alignment method according to one embodiment of the present invention is applicable.

Referring first to FIG. 1, there is shown a step-and-repeat type exposure apparatus for use in the manufacture of semiconductor microcircuits, to which apparatus an alignment method according to one embodiment of the present invention is applicable.

As shown in FIG. 1, the exposure apparatus includes a wafer X-Y stage ST which is movable to move a wafer WF in each of X and Y directions. The position of the X-Y stage with respect to the X and Y directions can be detected precisely by use of a measuring system (not shown) including one or more laser interferometers. The apparatus further includes driving motors XM and YM for moving the X-Y stage in the X and Y directions, respectively; a wafer $\theta$ stage WS for carrying thereon a wafer WF and being rotatable to rotationally move the wafer WF in a $\theta$ (rotational) direction; and an off-axis microscope OA usable to detect a prealignment mark formed on a wafer WF and to roughly align the wafer WF. The apparatus further includes a reduction projection lens system LN usable for the exposures of a wafer WF; a reticle stage RS for holding a reticle RT and being movable to move the reticle in each of the X, Y and $\theta$ directions; an illumination system ILL operable to illuminate a circuit forming pattern PT formed on the reticle RT so that the reticle pattern is transferred onto a wafer with the aid of the projection lens system LN; a laser tube LT; a polygonal mirror PM; a driving motor M for rotationally moving the polygonal mirror; a prism P1 effective to divide the path for the laser beam from the polygonal mirror PM; deflecting mirrors P2 and P3; beam splitters BS1 and BS2; objective lenses L1 and L2; mirrors MR and ML; photodetectors PDR and PDL; a control box CB which includes a control circuit comprising a central processing unit (CPU), memories, etc.; and a console CON by which an operator can specify various parameters and others.

In operation, the laser beam emanating from the laser tube LT is scanningly deflected by the polygonal mirror PM which is being rotated by the motor M. The deflected laser beam is divided by the prism P1 into two, for left and right field systems. Each of these split laser beams is directed by way of the beam splitter BS1 (BS2), the objective lens L1 (L2) and the mirror MR (ML) to corresponding one of two alignment marks formed on the reticle RT and then to corresponding one of two alignment marks formed on the wafer WF, so as to scan these alignment marks. The light reflected by each alignment mark goes back along its oncoming path to the beam splitter BS1 (BS2) and passes therethrough. The light from the beam splitter BS1 (BS2) is projected upon the photodetector PDR (PDL). Each photodetector PDR or PDL is operable to photoelectrically convert the light incident thereon and produces a corresponding electric signal. The output signal from each photodetector is applied to the control box CB and binarized (binary-coded) therein. From the thus obtained binary-coded signals, the relative position of the reticle and wafer alignment marks (see d1–d5 in FIG. 2D) can be determined by calculation. From this, any positional error of one shot area on the wafer WF with respect to the reticle RT can be detected. The manner of detection of such a positional error is well known in the art.

FIG. 2A shows an example of an alignment mark W which may be formed on a wafer and which comprises, in this example, four mark elements w1–w4. FIG. 2B shows an example of an alignment mark M which may be formed on a reticle and which comprises, in this example, two mark elements m1 and m2. FIG. 2C shows the positional relationship between the alignment marks W and M as assumed when the alignment is accomplished. FIG. 2D shows the manner of scan of an alignment mark M of a reticle and an alignment mark W of a wafer by use of a laser beam which is being scanningly deflected along a scan line SL in the course of the alignment operation.

FIG. 3 exemplifies the positions of alignment marks provided in association with each exposure region (shot area) of a wafer, the region being denoted by Sn in this Figure. As illustrated, in this example, each shot area of a wafer is provided with two alignment marks, namely left-hand and right-hand alignment marks $W_L$ and $W_R$.

In the present embodiment, as seen from FIG. 2D (more specifically, in the manner described with reference to FIG. 1), the alignment marks W and M are scanned with a laser beam along the scan line SL and the intervals or distances d1–d5 between the mark elements are measured. Then, from the results of measurement, relative positional errors $\Delta X$ and $\Delta Y$ between these marks with respect to the X and Y directions are determined in accordance with the following equations:

$$\Delta X = \{(d1-d2)+(d4-d5)\}/4 \quad (1)$$

$$\Delta Y = \{-(d1-d2)+(d4-d5)\}/4 \quad (2)$$

The positional errors $\Delta X$ and $\Delta Y$ are concerned with one wafer alignment mark, and actually the positional errors $\Delta X$ and $\Delta Y$ are detected with respect to each of the two alignment marks $W_L$ and $W_R$ (FIG. 3) provided on the opposite sides of each shot area. Assuming now that positional errors $\Delta X_{1L}$ and $\Delta Y_{1L}$ are obtained as a result of the measurement made with regard to a left-hand mark of a particular shot area while positional errors $\Delta X_{1R}$ and $\Delta Y_{1R}$ are obtained as a result of the measurement made with regard to a right-hand mark, then the positional deviation of that shot area with respect to the X, Y and $\theta$ directions can be determined e.g. in the following manner:

$$\text{The error in the X direction} = (\Delta X_{1L} + \Delta X_{1R})/2 \quad (3)$$

$$\text{The error in the Y direction} = (\Delta Y_{1L} + \Delta Y_{1R})/2 \quad (4)$$

$$\text{The error in the } \theta \text{ direction} = \tan^{-1}\{(\Delta Y_{1L} - \Delta Y_{1R})/D\} \quad (5)$$

wherein D is the distance, in the X direction, between the left and right marks of one shot area of a wafer. The corrected positional error with respect to the $\theta$ (rotational) direction may be called "chip rotation" or "chip $\theta$ error".

In the present embodiment, as will be described later in detail, some shot areas on a wafer WF are preselected automatically or in accordance with the designation by an operator. Before starting step-and-repeat exposures of the wafer WF, the "chip rotation" of each of the preselected shot areas is detected in accordance with equation (5). The results concerning the chip rotations of the preselected shot areas are averaged and, in accordance with the thus obtained average, the reticle RT is displaced rotationally in the $\theta$ direction by means of the reticle stage RS, such that the "$\theta$ error" of each preselected shot area is corrected. By the correction made in this manner, the "$\theta$ errors" of all the preselected shot areas can be reduced on the average.

Additionally, the position of the center of each of the preselected shot areas is determined in accordance with equation (4). From the center positions of these preselected shot areas, the positional error of a wafer as a whole, called "wafer rotation" or "wafer $\theta$ error", is determined.

Figure 4:
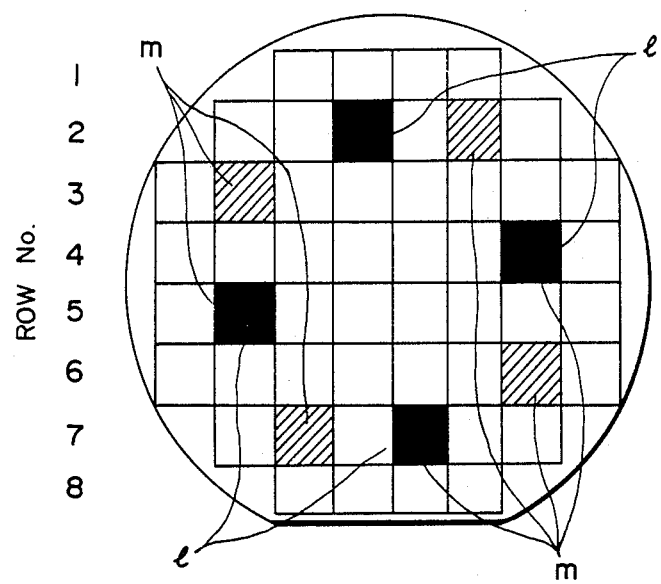
FIG. 4 is a schematic plan view of a wafer, showing an example of the layout of shot areas defined on the wafer.

FIG. 4 shows an example of the layout of shot areas defined on a wafer WF.

Figure 5A:
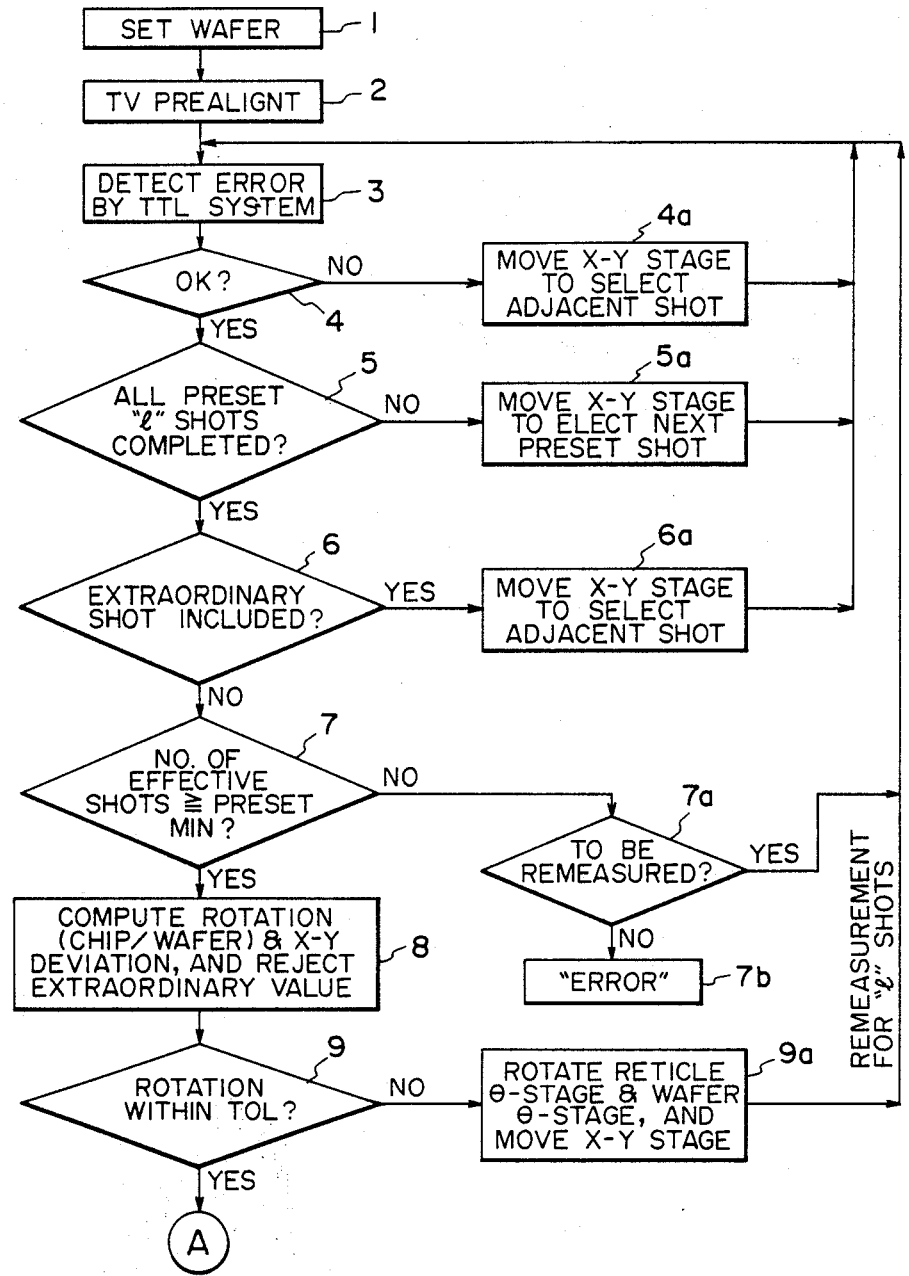
FIGS. 5A–5C are flow charts, respectively, showing in combination the flow of the alignment and exposure operation to be made in the exposure apparatus shown in FIG. 1.
Figure 5B:
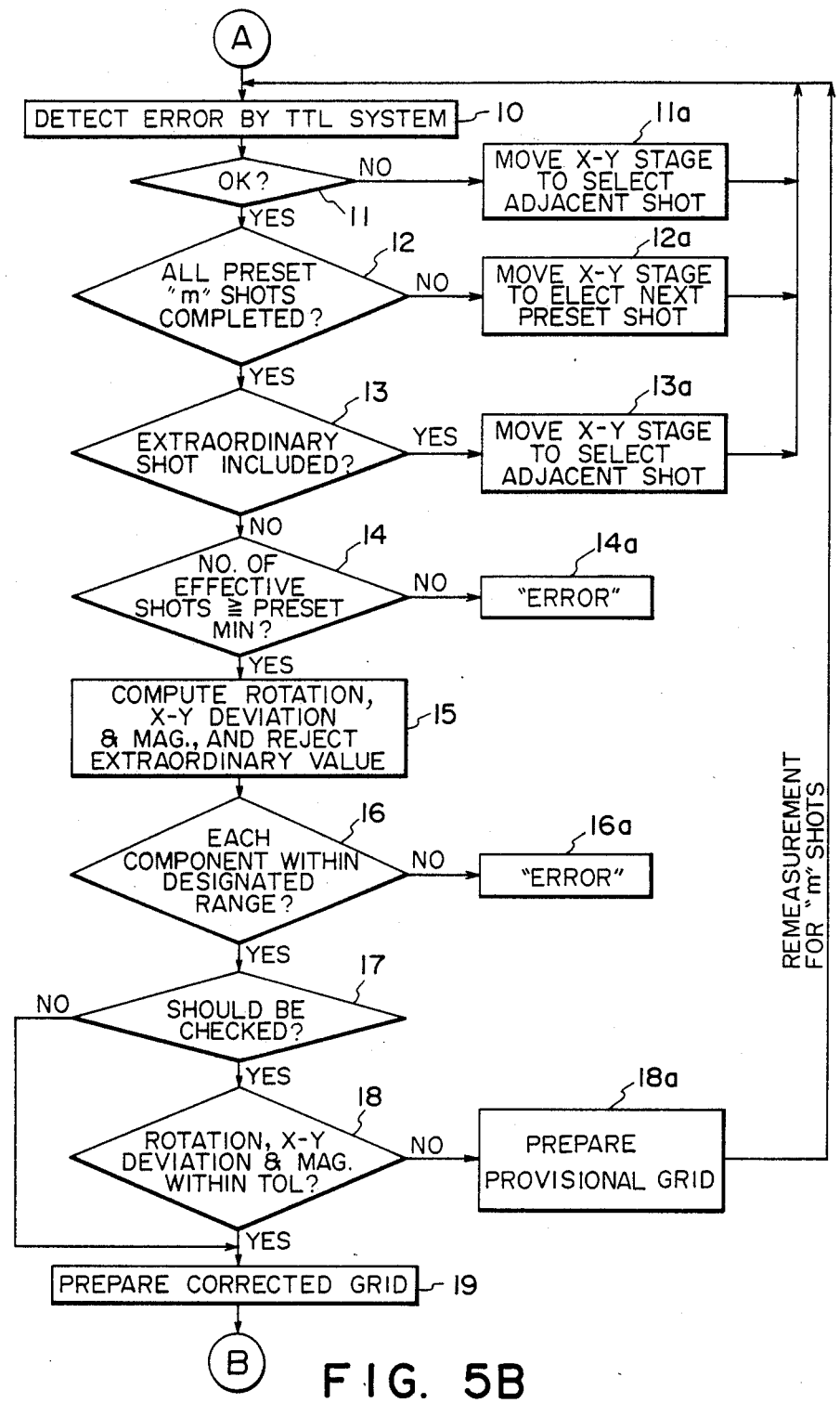
Figure 5C:
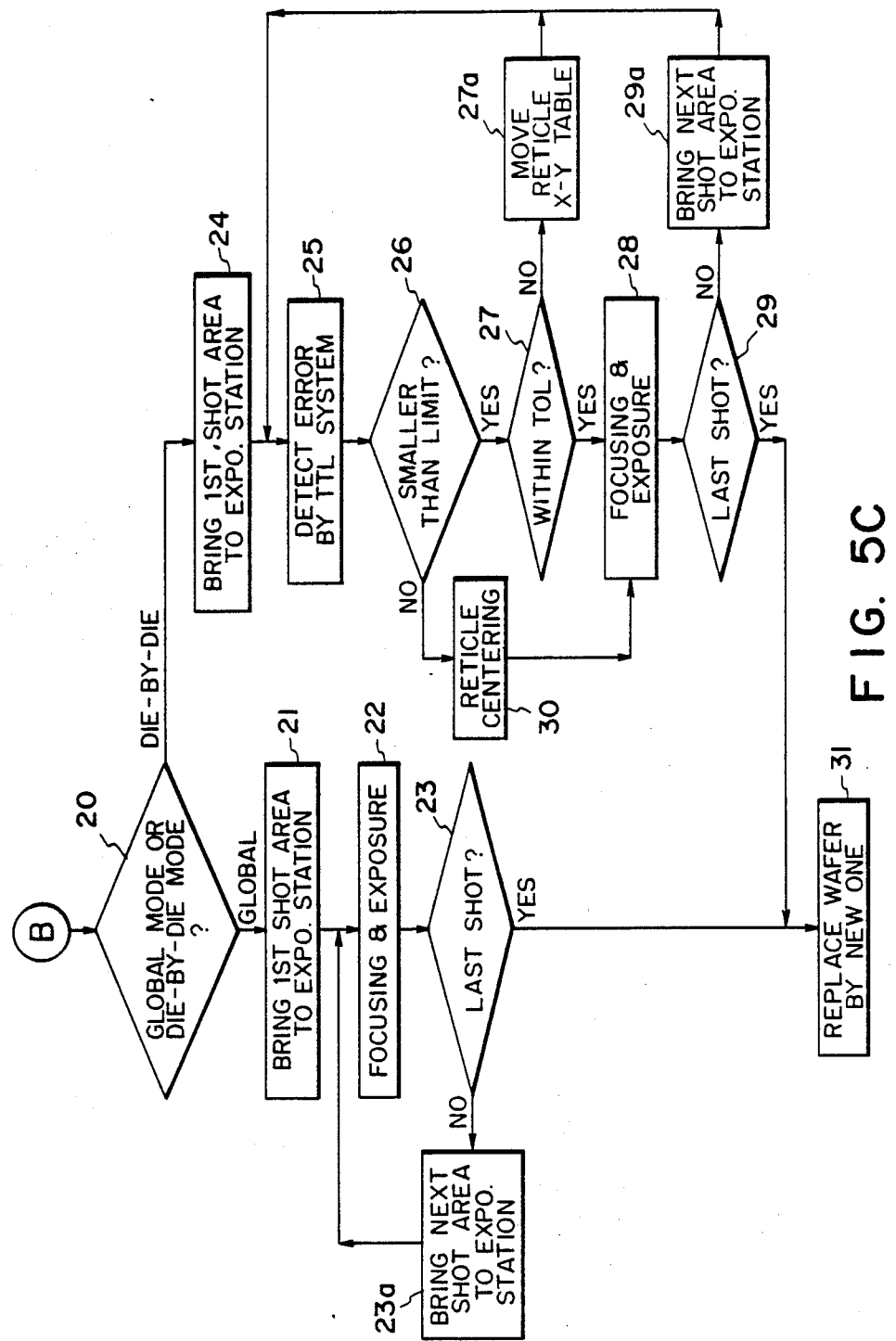

Referring now to the flow charts of FIGS. 5A–5C, description will made of details of the alignment and exposure operation made in the exposure apparatus of the present embodiment.

First, the outline will be described.

Steps 1 and 2

These steps are for the wafer setting and the TV prealignment.

Steps 3 to 9

These steps are for the correction of the "$\theta$ error". More specifically, while intermittently moving a wafer WF with the aid of the X-Y stage ST and in accordance with an absolute grid which corresponds to a design layout for the shot areas on the wafer WF, preselected ones of the shot areas of the wafer WF are subjected in sequence to the positional error measurement. The movement of the wafer WF at this time is controlled precisely by use of the outputs of the laser interferometers, not shown. From the results of measurement, the positional error of the wafer WF as a whole in the $\theta$ direction as well as the positional error of each of the preselected shot areas with respect to the $\theta$ direction are determined by calculation. Then, by rotationally displacing the reticle RT as well as the wafer WF, these rotational error components are corrected. Additionally, measurement is made again with respect to each of the preselected shot areas so as to check the correctness of the "$\theta$-error correction". As a result of these steps 3–9, the position of the wafer WF as well as the position of each shot area of the wafer, both with respect to the $\theta$ direction, are assured

Steps 10 to 19

These steps are for the preparation of a corrected grid. More specifically, while intermittently moving the wafer WF with the aid of the X-Y stage ST and in accordance with an absolute grid therefor, preselected ones of the shot areas on the wafer WF are subjected in sequence to the positional error measurement. At this time, the movement of the wafer is controlled precisely by use of the outputs of the laser interferometers, not shown. From the results of measurement, a corrected grid concerning the positions of the shot areas on the wafer WF is prepared. In other words, such information that concerns the coordinates or otherwise representing the actual positions of all the shot areas on the wafer WF is prepared. Such information may be prepared by use of a least square method, for example. The thus prepared corrected grid may be stored into a suitable memory. By aligning the wafer on the basis of the grid points (intersections) of the thus prepared corrected grid, an alignment accuracy not less than a predetermined value is assured.

While in the present embodiment, the grid information comprises the information that concerns the coordinates representing or corresponding to the positions of shot areas arrayed on a wafer, it is not always limited thereto. For example, the grid information may be given in terms of the amount of stepwise movement of a wafer to be set with respect to two and successive shot areas.

In relation to the preparation of a corrected grid, an "offset" may be specified in the present embodiment. This is to meet such a possibility that when, after the alignment is completed, patterns are photoprinted on a wafer which is coated with a photoresist material, there occurs shift of printed patterns in radial directions, in an eddy-like fashion or at random. To meet this, in the present embodiment, a suitable "offset" may be specified preparatorily from the console so that calculations for the preparation of a corrected grid may be made while taking into account the specified "offset". If this is done, the X-Y stage is moved for the alignment by an amount including the specified amount of offset. By doing so, of the misalignment factors described above, those having any regularity can be avoided effectively.

Next, details of the alignment and exposure operation will be described.

First, at step 1, a wafer WF is placed on the wafer $\theta$ stage WS. Then, at step 2, TV prealignment is effected by use of the off-axis microscope OA. By this, the position of the wafer WF can be relatively roughly adjusted.

The succeeding steps 3–9 provide a loop for effecting the "θ error correction" which is a part of the positional error measurement. First, at step 3, TTL (Through-The-Lens) positional error measurement is effected with respect to one of preselected sample shot areas of a number "l" (see four black-painted shots in FIG. 4). Hereinafter, these shot areas of the number "l" will be referred to also as "a first sample group". As is well known in the art, the said TTL positional error measuring process is a process for detecting a positional error by detecting a light reflected or diffracted by a mark on an article and passed through a projection optical system. In the present embodiment, the measurement is effected in the manner as has been described with reference to FIGS. 2 and 3 and by use of the projection lens system LN. The sample shot areas are preselected automatically in accordance with a predetermined rule which will be described later. However, the sample shot areas may be changed in accordance with the designation from the console CON.

Subsequently, at step 4, whether or not the measurement was good is discriminated. If not good, the sequence goes to step 4a by which the X-Y stage ST is moved stepwise so as to select an adjacent shot area. Then, the sequence goes back to step 3 and the positional error measurement is effected with respect to the newly selected shot area. The selection of such an adjacent shot area in an occasion where the measurement is not good, is made automatically in accordance with a predetermined rule. It should be noted that, in the present embodiment, the number of times for the selection of such an adjacent shot (step 4a) is limited to "two (twice)".

If the discrimination at step 4 shows that the measurement was good, the sequence goes to step 5 whereat discrimination is made as to whether the measurement with regard to all the preselected sample shots of the number "l" has been completed. If not completed, the X-Y stage is moved (step 5a) so as to bring the next one of the sample shots, to be examined subsequently, to the location underneath the projection lens system. Then, the sequence goes back to step 3 so that the positional error of the thus positioned shot is examined. In this embodiment, the number "l" is set preparatorily in accordance with the designation made at the console CON. However, in this embodiment, the sample shots "l" should be selected out of preselected shot areas of a number "m" (which will be described later and which will be referred to also as "second sample group") and, additionally, a relation k≦m should be satisfied.

If the result of discrimination at step 5 shows that the measurement with regard to all the shots "l" has been completed, the sequence goes to step 6 by which discrimination is made as to whether any extraordinary shot was included in the preselected shots. Here, the pitch error and the chip rotation of each of the preselected shots are examined. In this respect, the pitch error concerns, e.g., the difference between the intervals of the left and right marks of the reticle and the wafer with respect to the X direction. The chip rotation concerns, e.g., the difference between errors of the left and right marks of the reticle and the wafer with respect to the Y direction. If the maximum deviation of the detected pitch error or the chip rotation is not less than a predetermined value, the detected value is treated as extraordinary.

If an error detected with regard to a certain shot is considered as extraordinary, it is rejected and the sequence goes to step 6a whereat the X-Y stage is moved stepwise to select an adjacent shot. Then, the sequence goes back to step 3 whereby the measurement is effected again. As in the case of step 4a, the number of times for the selection of such an adjacent shot at the step 6a is limited to "two (twice)", and the selection is made automatically.

If, on the other hand, no extraordinary shot was included (step 6), the sequence goes to step 7 by which discrimination is made as to whether the number of effective shots is not less than a minimum number which is preset. Such a minimum number may be preset in consideration of the number "l" of the sample shots, and may be determined as follows, for example:

| No. "l" OF SAMPLE SHOTS | 2 | 4 | 6 | 8 | 12 | 16 |
|---|---|---|---|---|---|---|
| MIN. No. FOR EFFECTIVE SHOTS | 2 | 4 | 6 | 7 | 10 | 12 |

If the number of effective shots is less than the predetermined minimum, the sequence goes to step 7a. At step 7a discrimination is made as to whether an automatic remeasurement mode has been selected. If so, the sequence goes back to step 3 whereby the measurement is made again. Namely, in an occasion where an unexpectedly large portion of the data obtained by the measurement is rejected as extra ordinary, the remeasurement is made automatically. If the remeasurement mode has not been selected, the sequence is interrupted at step 7b as an "error". In this case, the operation of the apparatus is stopped temporarily. Then, an inquiry is made to the operator through the console as to in which one of "continue (skip)", "wafer replacement" and "retry" modes the apparatus should operate. Thus, the apparatus operates thereafter in accordance with the operator's command.

At step 8, calculations are made to determine the wafer rotation, the chip rotation (of each effective shot) and the positional errors in the X and Y directions (of each effective shot). At this time, any extraordinary value of the calculated values concerning the chip rotation and the X and Y errors is rejected. The rejection is made in accordance with the following rule: the calculated value concerning the i-th shot area (where i=any one of 1 to l) should be rejected as an extraordinary value if the residual error $r_i/\sigma_i$ of the i-th shot area is not less than a predetermined value, wherein $r_i$ is the difference between the calculated value concerning the i-th shot area and, e.g., the average of the calculated values concerning all the "l" shot areas and $\sigma_i$ is the standard deviation of the set of the remainder which results from excluding the residual error $r_i$ from the set of the residual errors $r_1-r_l$.

If the number of rejected extraordinary values is not smaller than a predetermined value, the sequence goes back to step 7a. Next, at step 9, discrimination is made as to whether each of the calculated wafer rotation and the average of the calculated chip rotations is within the range of a corresponding tolerance. If the wafer rotation or the average chip rotation goes beyond the corresponding tolerance, correction is made at step 9a. Namely, a reticle θ table of the reticle stage may be moved rotationally to correct the chip rotation. The wafer θ stage may be moved to correct the wafer rotation. Also, the X-Y stage may be moved to correct the X and Y errors. Thereafter, the sequence goes back to step 3 for the remeasurement with regard to the shot areas "l". Since the number of times for the remeasurement is limited to "two (twice)", the discrimination at step 9 is effected three times, at the maximum. In the remeasurement, the processes of the loop comprising steps 3-9 are repeated. In consideration of this, a slightly wider tolerance may be set for the third or final measurement so as to loosen the discrimination conditions. Of course, the tolerance may be changed in accordance with the designation made by the operator.

If the result of discrimination at step 9 is affirmative, the sequence goes to the loop of preparation of a corrected grid, comprising steps 10-18.

At step 10, the wafer WF is moved by the X-Y stage in accordance with the absolute grid so that one of preselected shot areas (second sample group) of a number "m" is brought to the position underneath the projection lens system LN. Then, by use of the projection lens system, any positional error of that one preselected shot area is measured. The measurement is made in the same manner as has been described with reference to the shot areas "l". Also, as in the case of the sample shot "l" of the first sample group, the sample shot "m" can be selected automatically. Of course, they may be changed in accordance with the designation made at the console CON.

Next, at step 11, whether or not the measurement was good is discriminated. If not good, the X-Y stage is moved (step 11a) so as to select an adjacent shot area, and the sequence goes back to step 10 for the measurement with regard to the newly selected adjacent shot. The selection of such an adjacent shot area in an occasion where the measurement with regard to a preselected sample shot is not good, is made automatically in accordance with a predetermined rule. Further, the number of times for the selection of such an adjacent shot is limited to "two (twice)".

If the result of discrimination at step 11 is affirmative, the sequence goes to step 12 whereat discrimination is made as to whether the measurement with regard to all the preselected sample shots of the number "m" has been completed. If not completed, the sequence goes to step 12a so that the X-Y stage is moved in accordance with the absolute grid so as to bring the next sample shot to the location underneath the projection lens system. Thus, the sequence goes back to step 10 to effect the measurement again. The number "m" is selected preparatorily in accordance with the designation made at the console. For example:

m=2, 4, 6, 8, 12 or 16.

In the present embodiment, some of the shots "m" of the second sample group are used also as the above-described sample shots of the number "l" of the first sample group for the θ-error correction. In consideration of this, when the measurement at step 10 is first to be made to the second sample group "m" just after completion of the θ-error correction at steps 3-9 using the first sample group "l", only the shot areas of the second sample group excluding those which are included in the first sample group, namely only those shot areas of the second sample group as depicted by hatching in FIG. 4, are selected as the subject of the measurement at step 10. However, it will be understood that in the succeeding loop or loops all the shot areas of the second sample group as depicted by the black-painted portions and the hatched portions in FIG. 4 are examined.

Referring back to FIG. 5B, if at step 12 the completion of the measurement with respect to all the "m" shot areas of the second sample group (while those included in the first sample group are excluded) is discriminated, the sequence goes to step 13 whereat discrimination is made as to whether any extraordinary shot is included. The discrimination at this step 13 is similar to that made at step 6. If there is an extraordinary shot, the X-Y stage is moved (step 13a) so as to select an adjacent shot area which is thereafter subjected to the measurement at step 10. The selection of such an adjacent shot is made in the same manner as those in the steps 4a and 6a. If, on the other hand, there is no extraordinary shot (step 13), additional discrimination is made at step 14 as to whether the number of effective shot areas is not less than a predetermined minimum. The minimum number is preset in accordance with the number "m" of the sample shot areas, as in the case of the first sample group "l". If the number of effective shot areas is less than the predetermined minimum, the sequence is interrupted at step 14a as an "error", as the above-described step 7b.

If the number of effective shot areas is not less than the predetermined minimum (step 14), calculations are made at step 15 so as to determine the wafer rotation, the chip rotation (of each effective shot area) and the X and Y errors (of each effective shot area), as well as the magnification. At this time, extraordinary one or ones of the calculated values are rejected. The rejection is made in accordance with the following rule:

The calculated value concerning the i-th shot area (where i=any one of 1 to m) should be rejected as an extraordinary value if the residual error $r_i/\sigma_i$ of the i-th shot area is not less than a predetermined value, wherein $r_i$ is the difference between the calculated value concerning the i-th shot area and the value obtained, e.g., by linearly approximating by use of a least square method, the calculated values concerning all the "m" shot areas and $\sigma_i$ is the standard deviation of the set of the remainder which results from excluding the residual error $r_i$ from the set of the residual errors $r_1$-$r_m$.

If the number of rejected extraordinary values (steps 14 and 15) is not smaller than a predetermined value, remeasurement may be made automatically as has been described with reference to step 7a. If this is desired, then the sequence goes back to step 10.

Next, at step 16, discrimination is made as to whether each component is within a corresponding designated range. Namely, with respect to each of the chip rotation, the wafer rotation, the magnification error and the layout error, discrimination is made as to whether it is not greater than a predetermined value which has been set by the operator. If the result of discrimination is negative, the sequence is interrupted at step 16a as an "error". The following operation may be made in the same manner as in the case of step 7b.

If the result of discrimination at step 16 is affirmative, discrimination is made at step 17 as to whether the remeasurement (check) is necessary or not. If it is necessary, then the sequence goes to step 18 whereat discrimination is made as to whether each of the wafer rotation (wafer θ error), the X and Y errors and the magnification is within the range of a corresponding tolerance. These tolerances are determined in accordance with the designation made at the console. The remeasurement is limited to twice. Accordingly, the discrimination at step 18 will be effected three times, at the maximum.

If the result of discrimination at step 18 is negative, the sequence goes to step 18a. At this step, a provisional grid is prepared by use of the calculated values having been obtained by the foregoing steps, the provisional grid being used to move the X-Y stage. Namely, when the sequence goes back to step 10, the X-Y stage ST is moved in accordance with the provisional grid prepared at step 18a. In the corrected grid preparation loop shown in FIG. 5B, the correction of the wafer $\theta$ error, the correction of magnification error and the correction of the X and Y errors, necessary for allowing measurement at step 10, are made by means of adjusting or correcting the stepwise movement of the X-Y stage ST with respect to the absolute grid.

If, on the other hand, the result of discrimination made at step 18 is affirmative, a corrected grid is prepared at step 19 on the basis of, for example, linear approximation using a least square method. Also, in a case where the remeasurement is not necessary (step 17), the sequence goes directly to the step 19 so that a corrected grid is prepared promptly.

Thereafter, the exposure sequence from step 20 (FIG. 5C) is executed. First, at step 20, one of a global alignment mode and a die-by-die alignment mode is selected. The selection is made in accordance with the designation made at the console.

If the global alignment mode is selected, the X-Y stage is moved (step 21) so as to bring a first shot area to the exposure station underneath the projection lens system. Then, at step 22, the focus adjustment and the exposure of the first shot area are effected. Then, at step 23, discrimination is made as to whether all the shot areas have been exposed. If not, the sequence goes to step 23a whereat the X-Y stage is moved stepwise in accordance with the corrected grid, having been prepared at step 19, so as to bring the next shot area to the exposure station. Thus, the sequence goes back to step 22 so that the focusing and the exposure are repeated. These operations are repeated until the last shot area is processed. When all the shot areas are processed, the wafer is replaced by another wafer (step 31) which will be processed in a similar manner.

If, on the other hand, the die-by-die alignment mode is selected, the X-Y stage is moved (step 24) so as to bring the first shot area to the exposure station. At step 25, the positional error of the first shot error is measured by use of the projection lens system LN. Subsequently, at step 26, discrimination is made as to whether the detected positional error is smaller than a predetermined limit. Such a limit has been preparatorily set in accordance with the designation made at the console CON. If the detected positional error goes beyond the limit, the reticle is centered (step 30) so that the reticle RT is positioned at a site at which the reticle RT has been set at the time of the corrected grid preparation (steps 10–19). Then, the sequence goes to step 28 such that, at the position according to the corrected grid prepared at step 19, the focus adjustment and the exposure are effected.

If, on the other hand, the result of discrimination at step 26 is affirmative, additional discrimination is made at step 27 as to whether the detected positional error is within the range of a tolerance which is predetermined. If the condition set at step 27 is not satisfied, the reticle stage RS is moved (step 27a) in the X and/or Y direction to correct the error. Then, the sequence returns to step 25. If, on the other hand, the result of discrimination at step 27 is affirmative, the focusing and exposure are made at step 28.

After the exposure, discrimination is made at step 29 as to whether all the shot areas have been exposed. If the last shot area has not yet been exposed, the sequence goes to step 29a so that the X-Y stage is moved stepwise in accordance with the corrected grid prepared at step 19 so as to bring the next shot area to the exposure station. Thus, the sequence goes back to step 25. If the exposure of the last shot area is completed, the wafer is replaced by another (step 31) which will be processed in a similar manner.

In accordance with the global alignment process described hereinbefore, the stepwise movement for bringing each shot area to the exposure station is made (i) with the chip rotation (chip $\theta$ error) and the wafer rotation (wafer $\theta$ error) being preparatorily corrected by the $\theta$-error correcting loop and (ii) in accordance with the corrected grid information prepared on the basis of the results of measurement made with respect to some shot areas. Therefore, a constant accuracy is always assured. Additionally, the X-Y stage is moved in accordance with the corrected grid information having been stored preparatorily, high-speed positioning is attainable with an advantageous result of enhanced throughput.

On the other hand, in accordance with the die-by-die alignment process described in the foregoing, first the $\theta$-error is corrected and then a corrected grid is prepared and, second, each shot area is aligned thereafter in the die-by-die process. Thus, it is not necessary to examine, at the time of the die-by-die alignment operation, the position of each shot area with respect to the $\theta$ (rotational) direction because the $\theta$ error has already been corrected. Therefore, it is only necessary to examine and adjust the position of each shot area with respect to the X and Y directions. This ensures higher-speed alignment as compared with the conventional die-by-die alignment method. Further, use of the corrected grid is effective to reduce the amount of movement of the wafer at the time of alignment, as compared with that required by the conventional die-by-die alignment process. Additionally, when any extraordinary value is detected as a result of the TTL detection, the wafer may be aligned in accordance with the corrected grid. Therefore, a constant accuracy can be retained.

In the present embodiment, as described hereinbefore, the chip $\theta$ errors are detected and corrected on the average, in addition to the correction of the wafer $\theta$ error. This is particularly effective in a case where an alignment mark is not formed at such position that a straight line connecting the center of the chip and the mark is parallel to the X or Y direction, namely in a case where the alignment mark is of the "off-center" type. If the measurement is made by use of marks disposed out of the center of the chip or by use of a mark formed at a single position, the position of the center of the chip determined on the basis of the result of measurement is deviated from the correct center. Such an error adversely affects the correction of the wafer $\theta$ error, with the result that the precision of a corrected grid is deteriorated.

Further, in the present embodiment, the measurement with regard to each of the sample shot areas is made by use of a TTL detecting system, not by an off-axis detecting system. Therefore, there is no possibility that any inconsistency between the moving direction of an X-Y stage and an off-axis binocular microscope causes an error in the corrected grid, as in the case of the off-axis alignment system.

The global alignment mode and the die-by-die alignment mode may be changed automatically or manually, if desired. If the mode changing is to be made automatically, discrimination may be made at step 20 as to the number of the calculated values having been rejected as extraordinary values. Alternatively, discrimination may be made to the variation (deviation) of the measured values. If there are many extraordinary values or large deviation, the global alignment mode may preferably be continued so as to assure average alignment. If not so, the die-by-die alignment mode may preferably be established so as to ensure highest-accuracy alignment.

In the present embodiment, after completion of the $\theta$ correction, the sequence returns to the initial stage so as to effect the remeasurement with respect to the first sample shot group of the "1" shot areas. By doing such confirmation of the $\theta$-error correction, the precision of the $\theta$-error correction can be improved significantly. As a result, the succeeding measuring and correcting operation can be made sufficiently exactly.

The rejection of extraordinary one or ones of the measured values, for assuring improved accuracy may be made on the basis of the variance of the measured values (e.g. $3\sigma$). Further, if many measured or calculated values are rejected as extraordinary values, the measurement may be made again automatically.

In the present embodiment, the wafer rotation is corrected by the wafer $\theta$ stage, and the chip rotation is corrected by the reticle $\theta$ stage. Further, for such a wafer rotation whose magnitude is less than the resolution of the wafer $\theta$ stage, it may be corrected by use of the X-Y stage by shifting, through a predetermined amount, the X-Y stage in the Y direction at the time when the X-Y stage is moved stepwise in the X direction. By doing so, the wafer can be aligned with respect to the $\theta$ direction with high accuracy.

Figures 6A, 6B:
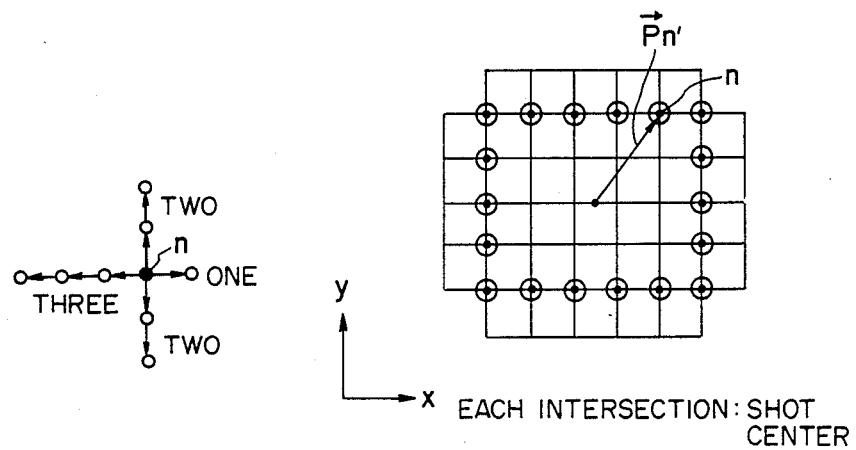
FIGS. 6A and 6B are schematic representations, respectively, for explaining the algorithm for selection of sample shot areas.

Referring now to FIGS. 6A and 6B, description will be made of the basic alogrithm for the selection of the sample shot areas of the number "m" described hereinbefore.

First, in this Specification, the index Ind(n) of a particular shot area "n" (FIG. 6A) is defined as the minimum number of the numbers obtained by counting those shot areas which are arrayed toward the outer periphery of the wafer from the shot area "n" in the four directions, namely, the positive and negative X directions and the positive and negative Y directions. For example, in the FIG. 6A case, Ind(n)=1.

Next, a set of the shot areas each having an index k is represented by $I_k$. Also, where the number of the members of the set $I_k$ is a, then this is written as "$I_k=a$". FIG. 6B shows, by circles, all the members of a set $I_1$ having the same index 1. Namely in this case, $I_1=18$. It will be understood that each outermost shot area has an index=0.

Further, the subsequent description will be made on the basis of the following assumption:

(1) The wafer has a shot layout wherein the shot areas have indices 0, 1, 2, ... and k.
(2) The number of all the shot areas is denoted by T. Thus:

$$T = I_0 + I_1 + \ldots I_K$$

(3) The number of sample shot areas to be selected in the global alignment or the die-by-die alignment is denoted by S.
(4) The vector $\vec{Pn}$ is expressed, when $\vec{Pn'}$ represents the vector directed from the center of the shot layout (it is not always the center of a certain shot area) to the shot area "n", in the following manner:

$$\vec{Pn} = \vec{Pn'}/|\vec{Pn'}| \text{ (to order the length to "1")}$$

If $\vec{Pn'} = (x_n, y_n)$, then;

$$\vec{Pn} = (x_n/\sqrt{x_n^2 + y_n^2}, y_n/\sqrt{x_n^2 + y_n^2})$$

(5) The unit vector which is directed from the center of the shot layout in each direction when the angle 360 degrees is divided equiangularly into the number "S" is denoted by $\vec{e_i}$. Thus, $$\vec{e_i} = [\cos\{2\pi(i-1)/S\}, \sin\{2\pi(i-1)/S\}]$$

where i=1, 2, ... or S.

Next, description will be made of general rules for the selection of the sample shots of the number "m".

1. First, consideration is made to $I_1$. If $I_1 \geq S$, the angle 360 degrees is divided equiangularly into the number "S" to provide $\vec{e_1}, \vec{e_2}, \ldots$ and $\vec{e_S}$. Subsequently, for each vector $\vec{e_i}$ (i=1, 2, ... or S), an inner product $\vec{e_i} \cdot \vec{p_j}$ is calculated; wherein i=1, 2, ... or S and j=1, 2 ... or $I_1$. The value "j" that provides the maximum is selected as a sample shot.

2. The calculation of the inner products is made in a counterclockwise order. If there are plural shot areas which provide the same inner product with respect to a certain vector $\vec{e_i}$, such shot area which is at the most counterclockwise position is selected as a sample shot.

3. If the same vector $\vec{Pn}$ is selected with respect to plural vectors $\vec{e_i}$, only such a sample shot which is related to the first-calculated vector $\vec{e_i}$ (i.e. the vector $e_i$ which is at the most clockwise position) is picked up, whereas the other sample shot or shots related to the remaining vector or vectors $\vec{e_i}$ are suspended. Thus, the calculation of the inner product is continued. This is to prevent duplicate selection.

4. If $I_1 < S$, then all the shot areas of the set $I_1$ are selected as sample shot areas. The remaining of the number "$S - I_1$" is selected out of the set $I_2$. Namely, the procedure from step 1. is effected while replacing "S" by "$I_1 - S$" and replacing "$I_1$" by "$I_2$".

5. The above-described operation is made in sequence with regard to all the sets $I_1, I_2, I_0, I_3, \ldots I_k$, in this order.

However, those shot areas whose centers are at distances not more than 20 mm from the center of the shot layout are excluded.

6. Where a character T' represents the sum of the number of such shot areas each having only one alignment mark and the number of such shot areas whose centers are at distances not more than 20 mm from the center of the shot layout, and if $T - T' < S$, then the procedure is interrupted as an error because S is too large.

Next, the selection of the sample shots "m" in the global alignment mode will be described in more detail.

The sample shots are selected under the following conditions:

1. In order to avoid inclusion of errors which may lead to the extraordinariness in the calculated values concerning the positional errors in the X, Y and θ directions, those shot areas which are at the outermost circumferential positions of a wafer should be excluded, if to do so is possible. This is because, usually, high measurement precision is not attainable at such portion of a wafer due to the residual effect of the treatment made to the wafer previously.

2. With respect to the translational (X and Y) component which may represented by "Sx, Sy", the rotational (θ) component which may be represented by "θx, θy" and the expansion/contraction coefficient which may be represented by "βx, βy", preferably they should have approximately the same accuracy (variance). Namely, the following relations should be satisfied:

$$V(Sx) \approx V(Sy)$$

$$V(\theta x) \approx V(\theta y)$$

$$V(\beta x) \approx V(\beta y)$$

3. While satisfying the above condition 2., the whole variation should be reduced to a minimum. Namely:
$$W = V(S) + V(\theta) + V(\beta)$$

should be suppressed to the minimum. It will be understood that, if $(x_i, y_i)$ represents the coordinate of the i-th sample shot area, then, from the above conditions 2. and 3., it follows that:

$$\sum_{i}^{N} x_i = \sum_{i}^{N} y_i = \sum_{i}^{N} x_i y_i = 0$$

$$\sum_{i}^{N} x_i^2 = \sum_{i}^{N} y_i^2$$

$$W = 1/\Sigma x_i^2 = 1/\Sigma y_i^2 \text{ (Min.)}$$

To achieve this, those of the shot areas remote from the center of the shot layout which are symmetrical with respect to the center of the shot layout and which are at positions concentric with respect to the center of the shot layout, may will be selected.

It is seen therefrom that, for the sample shot areas, preferably those shot areas which are placed out of the central portion of the wafer and inwardly next to the outermost shot areas with respect to the radial directions and also which are placed at such positions that are symmetric with respect to the center of the wafer.

4. In consideration of the precision of the stage and the interrelationship between the calculated values concerning the errors in the X, Y and θ directions, those shot areas which are spaced, as far as possible, from each other with respect to the coordinate system should preferably be selected.

Once the above-described conditions are satisfied, the accuracy of measurement is not deteriorated notably even if there is included an extraordinary shot or such a shot with respect to which the measurement is not satisfactorily attainable and, therefore, even when such a shot is excluded from the sample shot at the time of measurement.

In the present embodiment, the sample shot areas are selected automatically in accordance with the conditions described hereinbefore. This assures measurement of positional errors with a constant high accuracy. Accordingly, the accuracy of θ error correction at the steps 3-9 shown in FIG. 5A as well as the accuracy of the corrected grid prepared at the steps 10-19 shown in FIG. 5B are assured. Additionally, since the sample shot areas can be selected automatically, there is no disadvantage of decreased throughput. Further, the principle of selection of the sample shot areas is applicable, substantially in the same manner, to the selection of an alternative shot area which is required in an occasion where the measurement with respect to a certain sample shot area is not effective. The selection of such an alternative shot area can be made automatically.

While the invention has been described with reference to the structures disclosed herein, it is not confined to the details set forth and this application is intended to cover such modifications or changes as may come within the purposes of the improvements or the scope of the following claims.

What is claimed is:

1. An alignment method usable with a first object having a pattern, a second object having different shot areas, and a projection optical system effective to expose the shot areas of the second object to the pattern of the first object in a step-and-repeat manner, said method aligning in sequence the shot areas of the second object with respect to a projection region upon which the pattern of the first object is projected by the projection optical system, and comprising the steps of:

moving the second object in at least one of an X direction and a Y direction before start of the step-and-repeat exposures and making a first measurement, by use of the projection optical system, of a positional error of each of at least two shot areas of the second object with respect to said projection region;

rotationally moving the second object in a θ direction in accordance with the first measurement to determine the position of the second object with respect to the θ direction;

moving again the second object in at least one of the X direction and the Y direction after determination of the position of the second object with respect to the θ direction and making a second measurement, by use of the projection optical system, of a positional error of each of at least two shot areas of the second object with respect to said projection region;

generating and storing information concerning the correct layout position of the shot areas of the second object on the basis of the second measurement; and controlling the movement of the second object in at least one of the X direction and the Y direction at the time of the step-and-repeat exposures, in accordance with the stored information, so as to align in sequence the shot areas of the second object with respect to said projection region.

2. A method according to claim 1, wherein the first object is rotationally moved in the θ direction in accordance with the first measurement so that positional errors, in the θ direction, of the shot areas of the second object with respect to the pattern of the first object being projected upon said projection region are reduced on the average, whereby the position of the first object with respect to the θ direction is determined.

3. A method according to claim 1, wherein the information produced in said generating and storing step is generated on the basis of the second measurement and an offset value set in accordance with the designation made at a console.

4. A method according to claim 1, wherein the first measurement is repeated where a calculated value obtained in accordance with the first measurement is out of a tolerance and after the second object is rotationally moved in the $\theta$ direction and wherein the second measurement is effected after the calculated value comes within the tolerance.

5. A method according to claim 1, wherein said second measurement is repeated where a calculated value obtained in accordance with the second measurement is out of a tolerance and wherein the step-and-repeat exposures of the second object start after the calculated value comes within the tolerance.

6. An alignment method usable with a first object having a pattern, a second object having different shot areas, and a projection optical system effective to expose the shot areas of the second object to the pattern of the first object in a step-and-repeat manner, said method aligning in sequence the shot areas of the second object with respect to a projection region upon which the pattern of the first object is projected by the projection optical system, and comprising the steps of:
  moving the second object in at least one of an X direction and a Y direction before start of the step-and-repeat exposures and making a measurement, by use of the projection optical system, of a positional error of each of plural shot areas of the second object with respect to said projection region;
  producing information concerning variance of positional errors of said plural shot areas on the basis of the measurement and then excluding an extraordinary error from the positional errors by use of the information; and
  rotationally moving at least one of the first and second objects in a $\theta$ direction in accordance with the remainder of the positional errors, not having been excluded, to determine the position of at least one of the first and second objects with respect to the $\theta$ direction for the step-and-repeat exposures.

7. A method according to claim 6, wherein the measurement is repeated when the number of the excluded positional errors is not less than a predetermined number.

8. An alignment method usable with a first object having a pattern, a second object having different shot areas, and a projection optical system effective to expose the shot areas of the second object to the pattern of the first object in a step-and-repeat manner, said method aligning in sequence the shot areas of the second object with respect to a projection region upon which the pattern of the first object is projected by said projection optical system, and comprising the steps of:
  extracting plural shot areas from the shot areas of the second object while satisfying (i) a first condition according to which an outermost circumferential shot area is excluded, (ii) a second condition according to which the following relations are satisfied:

$V(Sx) \approx V(Sy)$, $V(\theta x) \approx V(\theta y)$ and $V(\beta x) \approx V(\beta y)$ wherein Sx and Sy are translational components, in X and Y directions, of positional errors which will be detected with respect to those shot areas when they are selected as the subject of measurement, $\theta x$ and $\theta y$ are rotational components of the positional errors, $\beta x$ and $\beta y$ are expansion coefficients, and V denotes variance, and (iii) a third condition according to which the total of the variances concerning the translational components, the rotational components and the expansion coefficients is made a minimum; and
  moving the second object before start of the stop-and-repeat exposures and detecting a positional error, by use of the projection optical system and with respect to said projection region, of a shot area extracted from the shot areas of the second object so as to determine the position of at least one of the first and second objects for the step-and-repeat exposures.

9. A method according to claim 8, wherein a shot area of the second object which is in the neighborhood of the center of the second object is not extracted as the subject of measurement.

10. A method according to claim 8, wherein, where the i-th coordinate on the second object is denoted by $(x_i, y_i)$ and where i is any one of 1 to N, the extraction is made so as to approximately satisfy the following relations:

$$\overset{N}{\Sigma} x_i = \overset{N}{\Sigma} y_i = \overset{N}{\Sigma} x_i y_i = 0$$

$$\overset{N}{\Sigma} x_i^2 = \overset{N}{\Sigma} y_i^2$$

and also to minimize W' which is given by the following equation:

$$W' = 1/\overset{N}{\Sigma} x_i^2 = 1/\overset{N}{\Sigma} y_i^2.$$

11. An alignment method usable with a first object having a pattern, a second object having different shot areas, and a projection optical system usable to expose the shot areas of the second object to the pattern of the first object in a step-and-repeat manner, said method aligning in sequence the shot areas of the second object with respect to a projection region upon which the pattern of the first object is projected by said projection optical system, and comprising the steps of:
  moving the second object in at least one of an X direction and a Y direction before start of the step-and-repeat exposures and making a first measurement of a positional error, by use of the projection optical system and with respect to the first object, of each of plural shot areas when it is placed at said projection region;
  rotationally moving at least one of the first and second objects in a $\theta$ direction in accordance with the first measurement to determine the position of at least one of the first and second objects with respect to the $\theta$ direction;
  moving again the second object in at least one of the X direction and the Y direction after determination of the position of said at least one of the first and second objects with respect to the $\theta$ direction and making a second measurement of a positional error, by use of the projection optical system and with respect to the first object, of each of plural shot areas when it is placed at said projection region;
  generating and storing information concerning the correct layout positions of the shot areas on the second object in accordance with the second measurement; and controlling the movement of the second object in at least one of the X direction and the Y direction for the step-and-repeat exposures, in accordance with the generated and stored information, so as to bring one by one by the shot areas of the second object to said projection region, and effecting a third measurement for detecting a positional error, with respect to the first object, of such a shot area that has been brought to said projection region and, thereafter, controlling the movement of the first object in at least one of the X direction and the Y direction in accordance with the third measurement.

12. A method according to claim 11, wherein whether or not the third measurement is to be executed is determined in accordance with the second measurement.

13. An alignment method, usable with a first object having a pattern and a second object having different shot areas, for aligning in sequence the shot areas of the second object with respect to the first object, said method comprising the steps of:

moving the second object in at least one of an X direction and a Y direction before start of step-and-repeat exposures and making a first measurement of a positional error of each of at least two shot areas of the second object with respect to the first object;

rotationally moving the second object in a $\theta$ direction in accordance with the first measurement to determine the position of the second object with respect to the $\theta$ direction;

moving again the second object in at least one of the X direction and the Y direction after determination of the position of the second object with respect to the $\theta$ direction and effecting a second measurement of a positional error with respect to the first object;

generating and storing information concerning the correct layout positions of the shot areas of the second object on the basis of the second measurement; and controlling the movement of the second object in at least one of the X direction and the Y direction at the time of the step-and-repeat exposures, in accordance with the generated and stored information, so as to align in sequence the shot areas of the second object with respect to the first object.

* * * * *